United States Patent [19]

Rogacki et al.

[11] Patent Number: 5,079,502

[45] Date of Patent: Jan. 7, 1992

[54] PROXIMITY SENSOR HAVING A BRIDGE CIRCUIT WITH A VOLTAGE CONTROLLED RESISTANCE

[75] Inventors: Steven A. Rogacki; Alfred F. Herbermann, both of Ann Arbor, Mich.

[73] Assignee: Syron Engineering & Manufacturing Corporation, Saline, Mich.

[21] Appl. No.: 487,691

[22] Filed: Mar. 2, 1990

Related U.S. Application Data

[63] Continuation-in-part of Ser. No. 194,339, May 16, 1988, Pat. No. 4,906,926.

[51] Int. Cl.$^5$ .................................................. G01B 7/14
[52] U.S. Cl. ........................... 324/207.19; 324/207.12; 324/207.13; 324/207.15; 324/207.26
[58] Field of Search .............. 324/226, 207.11, 207.13, 324/207.14, 207.15, 207.16, 207.19, 207.22, 207.26, 236, 207.12; 340/686, 870.31

[56] References Cited

U.S. PATENT DOCUMENTS

| | | | |
|---|---|---|---|
| 3,454,689 | 7/1969 | Strauss et al. | 340/686 |
| 3,601,664 | 8/1971 | Auer, Jr. et al. | 324/207.26 |
| 4,629,983 | 12/1986 | Boomgaard et al. | 324/207.19 |

Primary Examiner—Walter E. Snow
Attorney, Agent, or Firm—Dykema Gossett

[57] ABSTRACT

Proximity sensors for detecting the presence of metal objects such as sheet metal workpieces within workpiece engaging devices such as grippers and shovels. The proximity sensors are jacketed in a stainless steel casing, making them rugged and resistant to impact damage. Monitor circuits are used with the sensor which enable the devices to sense objects through their metal casing, these objects being disposed upon the sensor casing. A thresholding circuit and a delay circuit are further disclosed and which reduce erroneous indications of the presence of the metal objects upon the sensor. Other embodiments are disclosed which allow for the proper alignment of metallic workpieces within an area and for the determination of the height of a stack of workpieces.

10 Claims, 4 Drawing Sheets

PROXIMITY SENSOR HAVING A BRIDGE CIRCUIT WITH A VOLTAGE CONTROLLED RESISTANCE

This is a continuation-in-part of application Ser. No. 07/194,339, which was filed on May 16, 1988, now U.S. Pat. No. , 4,906,926.

BACKGROUND AND SUMMARY OF THE INVENTION

This invention relates to proximity sensors and related circuits, and particularly to such systems adapted for sensing metal workpieces in hostile conditions.

Proximity sensors are used in various facets of manufacturing for detecting the approach or the presence of metal objects. An example of a suitable application for such devices is for automated sheet metal forming lines such as progressive die press operations where proximity sensors could be used for determining whether or not material handling systems are properly engaging workpieces as they are moved from one work station to another. If a part engaging member such as a shovel or articulated gripper does not properly receive a workpiece and such absence is detected, the material handling and fabrication machinery could be interrupted to correct the failure. Workpieces which are not in their proper position can lead to the generation of scrap and can also damage equipment of the fabrication system.

Inductive type proximity sensors have been in use for many years and operate on the principle that approaching magnetic objects change the inductive characteristics of the sensor, which, in a simplified form, is no more than a coil of wire wrapped around a ferrite core. This change in inductance or in the corresponding impedance characteristic, produces a reduced output from a resonant tank circuit which the sensor is a part of. The tank circuit voltages are detected and output through appropriate signal processing electronics. Present proximity sensor systems operate at relatively high frequencies (e.g. 200 to 300 KHz), and are used with high "Q" tank circuits (i.e. circuits with high impedance to resistance ratios). Such sensor systems cannot sense through a layer of metal to detect objects on the opposite side of the layer, due to eddy current losses occurring in the metal layer. Accordingly, such proximity sensors have a sensing face which is nonmetallic. Typically, the coils are potted using epoxy compounds or other plastic materials which cover one sensing face. In many applications for proximity sensors such as the application discussed above, proximity sensors are exposed to extreme environmental conditions where they can be struck by metal workpieces and subjected to abrasives, cutting fluids, etc. For such applications, the vulnerable configuration of prior art proximity sensors renders them unsuited for use. Accordingly, there is a need to provide a proximity sensor which can be encased in a durable material such as a metal, while providing sensitivity for detecting other metal objects which may be fixed upon the surface of the durable material.

There is a need for such proximity sensors to be configured such that false readings or outputs thereof are not generated due to the "bouncing" of the workpiece within the manufacturing handling system. For example, if the sensor were placed upon the surface of a workpiece gripper, the gripper would initially sense the presence of the workpiece that was positioned upon it. If the workpiece bounced, however, there would be a window of time before the workpiece was repositioned or fixed upon the sensor, in which the sensor would output an erroneous indication that the workpiece was not within the gripper. Such an erroneous indication could cause great harm to the entire manufacturing process (i.e., shutting down an assembly line) and should be avoided.

In addition to the foregoing, since present inductive proximity sensors are used with high "Q" tank circuits, and since a full metallic enclosure results inherently in a circuit with a low "Q" value, there is a need for an amplifier system which can function with a low "Q" circuit and detect small changes in that "Q" value.

In accordance with this invention, several embodiments of proximity sensor systems achieving the above mentioned desirable characteristics are provided. Proximity sensors according to this invention can be encased in metal such as stainless steel while enabling the detection of approaching metal objects and, more importantly, of metal objects which are fixed in a stationary manner upon the metal case of the sensor. The resulting sensor is extremely durable and can therefore be used in hostile operating conditions. These capabilities are achieved, in part, by driving the proximity sensor coil at a relatively low frequency, for example, at less than 20 KHz. The stainless steel encasing material is relatively invisible to the low excitation frequency, since eddy current losses decrease with frequency. The reason that a portion of the sensing field extends through a given thickness of stainless steel is that one product of circuit "Q" and skin depth have been maximized. Skin depth is greater for a high resistivity material like stainless steel and it also is larger for lower frequencies. Therefore, the relative "invisibility" of the stainless is due to the low frequency used and to the high electrical resistivity of the stainless. These features make it necessary to employ relatively low "Q" tank circuits (since "Q" decreases with frequency). Various circuit designs are disclosed as means for evaluating small changes in output of the sensing inductor which provide excellent sensitivity, while enabling use of low "Q" low frequency sensing circuits. Further, the sensors of the embodiments of this invention are relatively insensitive to the bouncing of the workpiece within the workpiece handling system and provide a detection signal output even during workpiece bouncing conditions.

Additional benefits and advantages of the present invention will become apparent to those skilled in the art to which this invention relates from the subsequent description of one preferred embodiments and the appended claims, taken in conjunction with the accompanying drawings.

DETAILED DESCRIPTION OF THE INVENTION

Figure 1:
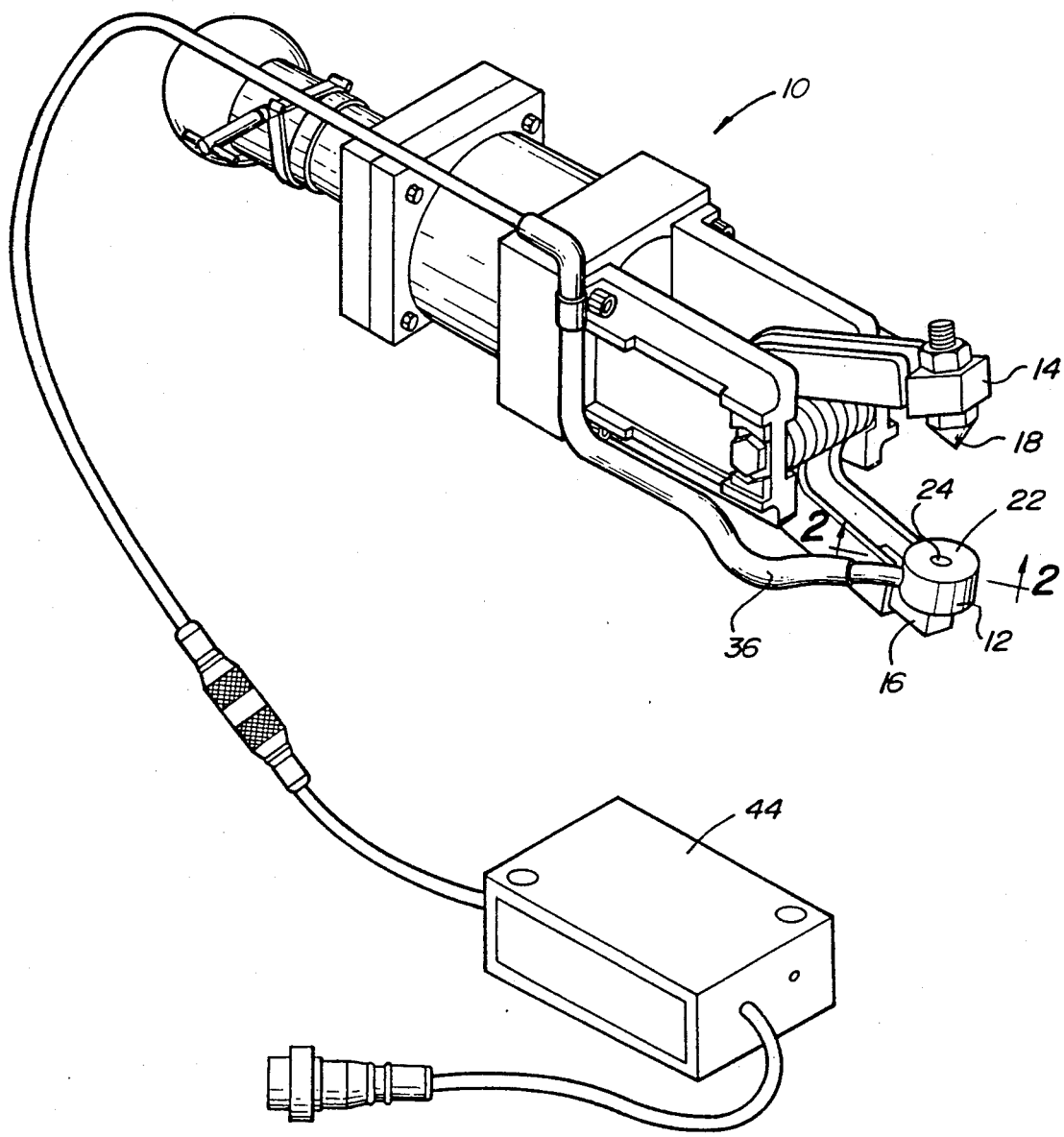
FIG. 1 is a pictorial view of a workpiece gripper incorporating a proximity sensor in accordance with a first embodiment of this invention.

FIG. 1 illustrates a gripper assembly, generally designated by reference number 10, incorporating a proximity sensor 12 in accordance with one embodiment of the present invention. Gripper assembly 10 is robotically controlled to properly position gripper jaws 14 and 16 to engage a workpiece. As previously mentioned, there is a need to determine with certainty whether or not workpiece handling systems have, in fact, properly received a workpiece such as a sheet metal blank. Gripper assembly 10 incorporates proximity sensor 12 as the engaging face of jaw 16. Thus, when a sheet metal workpiece is received between jaws 14 and 16, and the jaws are clamped against the workpiece, the workpiece is in direct contact with proximity sensor 12. Due to the rugged construction of proximity sensor 12, it is capable of restraining significant gripping forces. Jaw 14 forms a gripper point 18 which slightly penetrates the workpiece surface to ensure positive engagement. Monitor 44 provides the electrical circuitry which outputs a digital signal (although analog outputs are possible) which triggers associated equipment such as warning devices or automatic shut-down systems.

Figure 2:
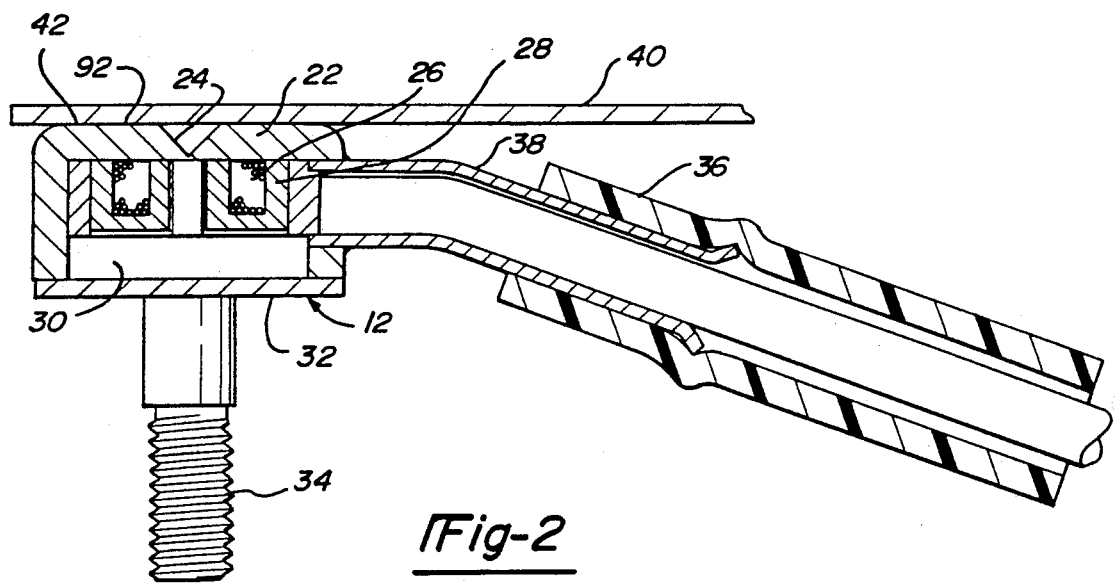
FIG. 2 is a cross-sectional view through the gripper sensor taken along line 2—2 of FIG. 1.

With particular reference to FIG. 2, details of the construction of proximity sensor 12 are shown. Proximity sensor 12 includes a cup-shaped housing 22 made from a stainless steel material. A central depression 24, defined by top plate 25 of housing 22, receives gripper point 18 when the jaws 14 and 16 are closed without a workpiece present. An inductor coil 26 is wrapped within ferrite core 28 and potting material is employed to fill the voids around the core. Coil 26 generates a sensing field which penetrates housing 22 and is present at face 42. Additional encasing metal layers are formed by end plates 30 and 32. Columnar member 31 is also defined by housing 22 and is coupled to top plate 25 and to bottom plate 30 in a cooperative "I-beam"-like arrangement. That is, impaction force is created upon plate 25 when jaws 14 and 16 are closed. This impaction force is transmitted through columnar member 31 and subsequently to plate 30 while being distributed therethrough. Such use of member 31 minimizes the structural deformation of plate 25 by the created impaction force thereby minimizing structural failure thereof. Threaded mounting post 34 enables sensor 12 to be secured to jaw 16. Cable assembly 36 is connected to opposite ends of coil 26 and is held in position by metal tubular stiffener 38. FIG. 2 illustrates a sheet metal workpiece 40 in close contact with sensing face 42.

Figure 3:
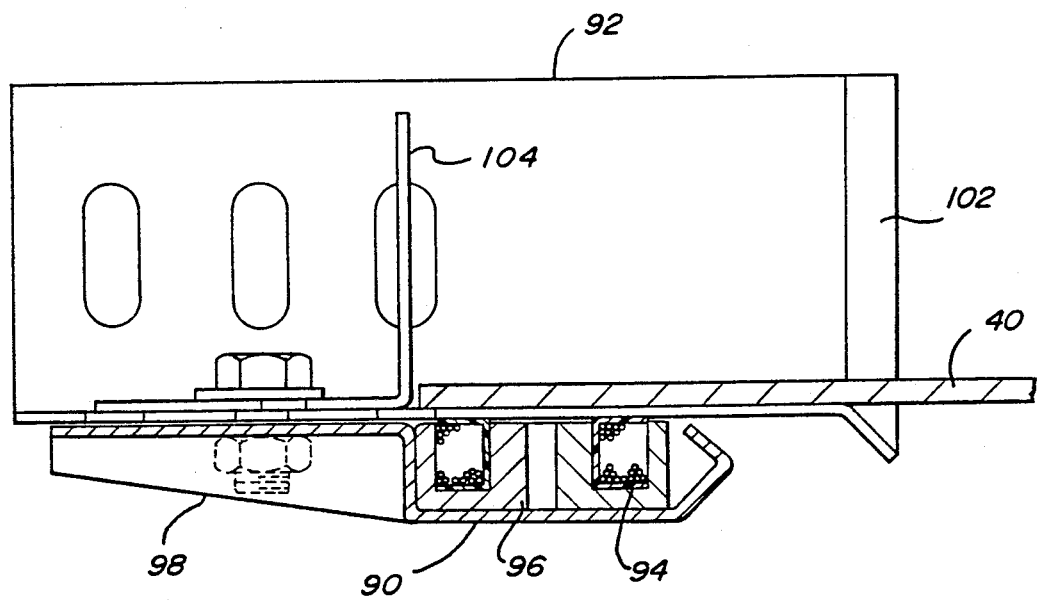
FIG. 3 is a partially elevational and partially cross-sectional view of a proximity sensor in accordance with a second embodiment of this invention used in conjunction with a shovel type metal workpiece transporting device.

A proximity sensor in accordance with the second embodiment of this invention is shown in FIG. 3 and is generally designated by reference number 90. Sensor 90 is particularly adapted to be mounted to a metal workpiece engaging "shovel" 92 which is adapted to engage and lift a corner of a sheet metal blank. Shovel 92 defines a flared opened end 102 and a barrier 104 which controls the position of one workpieces. Shovel 92 is made from stainless steel with sensor 90 mounted to the bottom of the shovel, such that it senses the workpiece through the bottom surface of the shovel. Sensor 90 includes coil 94 wrapped around ferrite core 96, and is mounted to shovel 92 via bracket 98.

Figure 4:
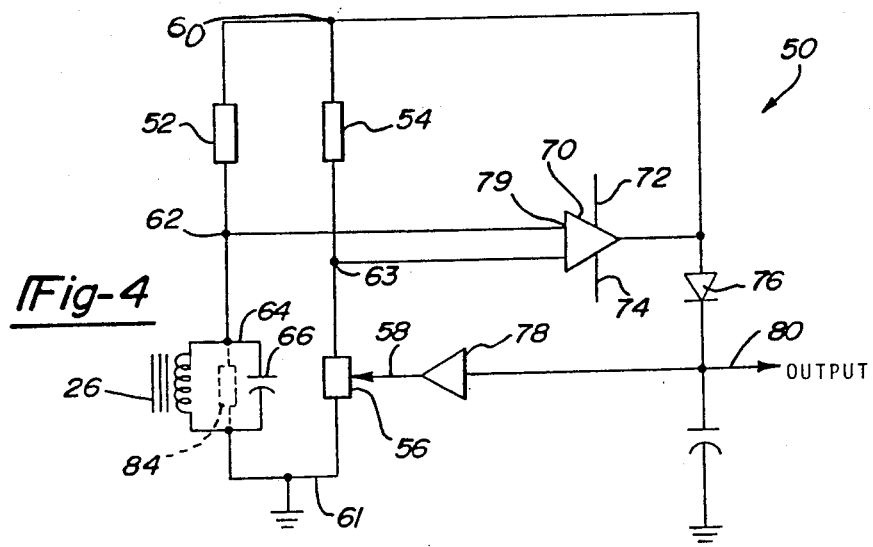
FIG. 4 is an electrical schematic diagram showing a simplified electrical circuit for a monitor in accordance with a first embodiment of this invention.

An example of circuitry which enables proximity sensor 12 to detect the approach of a workpiece 40 or the placement of workpiece 40 upon the sensor is shown in FIG. 4. This figure is a simplified schematic for monitor circuit 50. Circuit 50 is particularly useful for use with a low inductance sensor coil, such as that shown in FIG. 4, which in accordance with an experimental embodiment of applicant, had an inductance of about 4 mH. Circuit 50 includes a bridge circuit having a pair of arms formed by fixed value resistors 52 and 54. The lower half of one bridge is formed by voltage controlled resistor 56 which provides a variable resistance as a function of input voltage on line 58. The remaining leg of the bridge is formed by L-C parallel resonant tank circuit 64 which includes proximity sensor coil 26 and capacitor 66. Bridge nodes 60 and 61 are power inputs and nodes 62 and 63 are outputs. The outputs from bridge nodes 62 and 63 are fed into OP/AMP 70 which amplifies their difference and receives a power supply voltage at inputs 72 and 74. The output of OP/AMP 70 is directed back through bridge node 60 and is also directed through diode 76 to OP/AMP 78, having an output which drives voltage controlled resistor input 58. Line 80 provides an output signal for signal processing and threshold detecting circuits, according to well known designs.

In operation of monitor circuit 50, L-C tank circuit 64 operates at resonance and can be represented by an equivalent resistor 84. Monitor circuit 50 would preferably be designed to operate at a frequency in the range of up to 20 KHz. In one experimental embodiment, monitor circuit 50 oscillated at about 1000 Hz. During normal operation, the bridge is intentionally maintained slightly out of balance through appropriate selection of the elements of the arms of the bridge. When a metal object approaches or is fixably placed upon housing 22 proximity sensor coil 26, the "Q") of the circuit decreases due to a change in the inductance (or corresponding impedance) value of coil 26, which reduces the effective resistance of equivalent resistor 84. This imbalance causes the voltage along OP/AMP positive input 79 to decrease, which signal is fed back to voltage controlled resistor 56, causing its equivalent resistance value also to drop, tending to maintain the circuit in balance. The combined effect on the equivalent resistance of resistor 84 and voltage controlled resistor 56 causes the alternating signal through the circuit detected at output line 80 to be decreased upon the approach of a ferrous metal object to proximity coil 26 or the placement of this object upon casing 22. The circuit therefore operates as a "Q" multiplier by exaggerating small changes in the L-C tank circuit 64 provided by the balancing influence of voltage controlled resistor 56.

Figure 5:
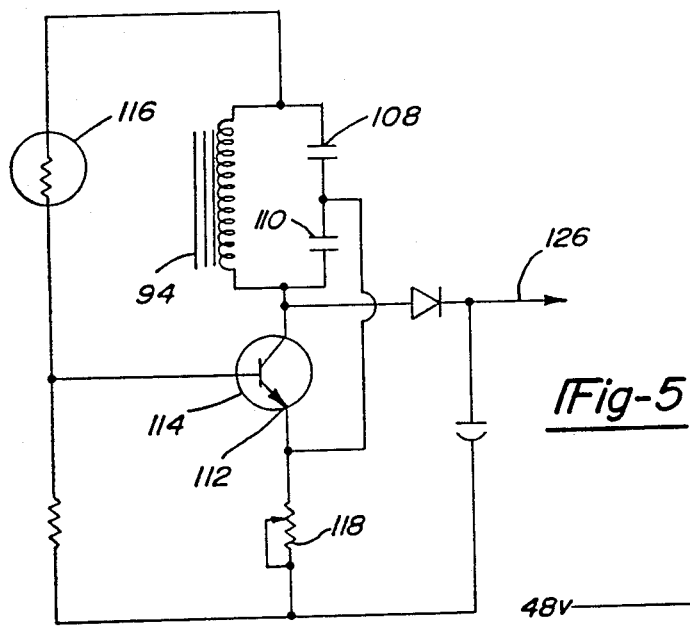
FIG. 5 is a simplified electrical circuit of a monitor according to a second embodiment of the invention.
Figure 6:
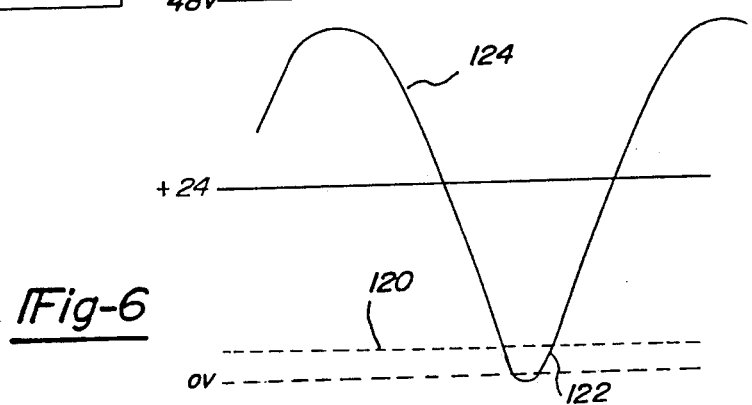
FIG. 6 is a waveform diagram related to the circuit shown in FIG. 5.

FIG. 5 illustrates another embodiment of a monitor circuit 106 which may be used with proximity sensor 90 having a physically large coil with a corresponding large inductance value associated therewith. This design employs a modified Colpitts oscillator, comprising coil 94 in a tank circuit with capacitors 108 and 110 with an output between the capacitors fed into emitter 112 of transistor 114. Temperature compensating thermistor 116 and variable resistor 118 are used to adjust the biasing and operating point of transistor 114. FIG. 6 illustrates oscillations taking place through monitor circuit 106. The curves can be divided into two sections, the first section 124, above dotted line 120, represents the free oscillations or "ringing" within the tank circuit which is driven by the portion of the curve represented by 122 which is the region that transistor 114 is conducting. Accordingly, the system operates like a conventional Colpitts oscillator but with the transistor operating only in one lower portion of the curve as a driver, and thus the system is a non-linear driven oscillator. Monitor circuit 106 operates best at frequencies of around 1000 Hz.

In operation, monitor circuit 106 is allowed to oscillate as shown in FIG. 6, but upon the approach of a ferrous material or the placement of the material upon casing 22, the inductive coupling and eddy current loses within that material absorb energy, thus significantly reducing the amplitude of curve 124 which is coupled to output line 126.

Figure 7:
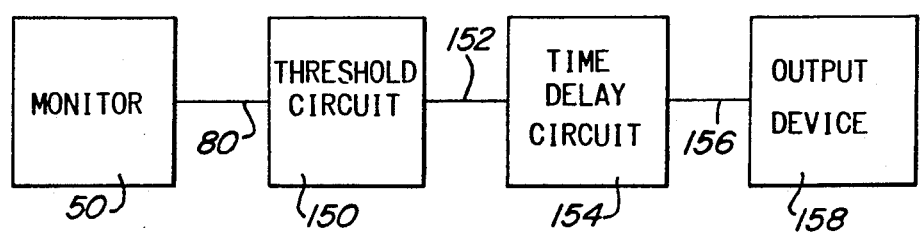
FIG. 7 is an electrical schematic diagram of a sensor circuit made accordance with the teachings of this invention.

Referring now to FIG. 7, there is shown a sensor circuit 148 of the preferred embodiment of this invention having monitor circuit 50 coupled to a threshold circuit 150 by output line 80. Threshold circuit 150 then measures the amplitude of the oscillations associated with line 80 and compares the measured amplitude with a fixed or predetermined amplitude value stored therein. If the measured amplitude exceeds (or alternatively is less than) the predetermined value, then threshold circuit 150 will produce a signal on line 152 indicating the presence of a metal workpiece in close proximity to or fixed upon casing 22. The threshold circuit 150, in one embodiment, comprises a typical Schmitt trigger device.

The use of such an adjustable threshold circuit 150 in combination with the ability to detect a metal workpiece directly resident upon casing 22 allows sensor circuit 148 to detect only metal workpieces directly resident upon casing 22 or alternatively within some range with respect to casing 22. Additionally, the sensor 12 of this invention will not respond to substantially any stainless steel member, such as gripper point 18, due to the frequency at which the sensor 12 is oscillating. This feature, in combination with the use of the aforementioned threshold circuit 150, allows sensor 12 to detect the presence (or absence) of a metal workpiece residing between gripper point 18 and sensor 12. By allowing the sensor to determine the presence of a workpiece directly in contact with its casing and employing a thresholding circuit to allow workpiece indications upon the presence of the workpiece, on the sensor, such erroneous indications (i.e., detection of metal workpieces outside of the defined range) may be reduced. This threshold circuit 150 then produces an affirmative acknowledgement of the presence of the workpiece when the amplitude of the signal on line 80 is compared to the fixed or predetermined level in the manner previously described.

Signal line 152 is further coupled to a time delay circuit 154 which produces a signal on line 156. Delay circuit 154 maintains the signal on line 156 for a predetermined amount of time after the signal on line 152 is absent. This use of delay circuit 154 provides for the substantial reduction of detection errors associated with the bouncing of the metal workpiece off of sensor casing 22 during normal material handling or gripping operations.

That is, after the metal workpiece initially contacts sensor casing 22, signal on line 152 is generated and shortly thereafter, signal on line 156 is generated. If the metal workpiece bounces off of casing 22, then the generation of signal on line 152 is terminated, correctly indicating the absence of the metal workpiece from the surface (or close proximity to) casing 22. Since, however, the workpiece is still within the grasp of the material handling or manufacturing system (i.e., between jaws 14 and 16) such an indication would be erroneous. Therefore, time delay circuit 154 causes signal on line 156 to continue to reflect the correct presence of the metal workpiece. Upon the return of the metal workpiece to casing 22, signal on line 152 is generated and signal on line 156 continues to be held constant. It is only after a set amount of time has passed, without the further presence of the metal workpiece upon, or in close proximity to casing 22, that signal on line 156 reflects the absence of the workpiece. If this time has passed without the return of the workpiece to casing 22, then it is correctly indicated as signal on line 156 that the workpiece is no longer within this portion of the handling system.

Output device 158 may be one of a plurality of types including a programmable logic controller, and receives signal on line 156 and provides an output (i.e., such as visual display) indicating the presence, absence or, alternatively, both the presence and the absence of the workpiece within a portion of the handling or manufacturing system.

Figure 8:
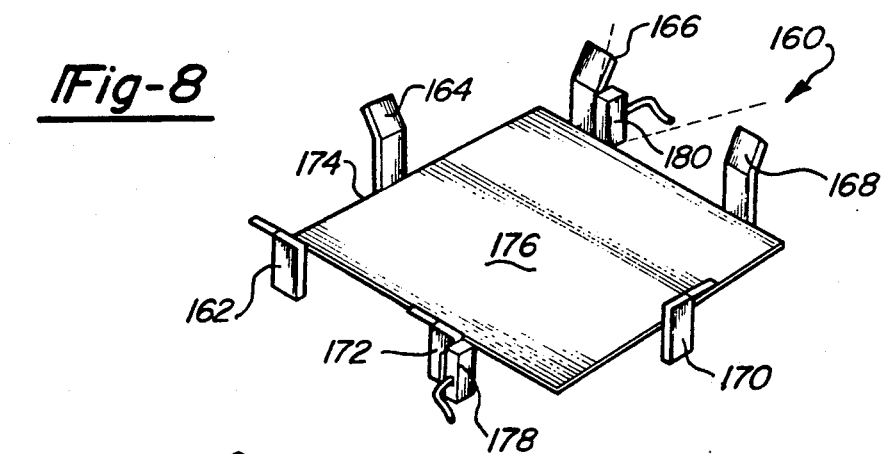
FIG. 8 is a pictorial view of proximity sensors made in accordance with a third embodiment of this invention used to properly align a metal workpiece.
Figure 9:
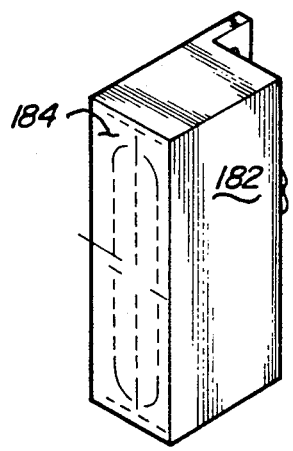
FIG. 9 is a pictorial view of one of the proximity sensors shown in FIG. 8.

Referring now to FIG. 8, there is shown a metal workpiece alignment apparatus 160 containing a plurality of vertical members 162-172 which define a workpiece receiving area 174 upon which a workpiece 176 is to be received. Apparatus 160 further contains proximity sensors 178 and 180 which substantially correspond to sensor 12 shown generally in FIGS. 1 and 2. As shown in FIG. 9, sensor 178 (or 180) is deployed or mounted within a generally rectangular, closed housing 182 defining a face portion 184 through which sensor 178 (or 180) may direct a magnetic field. In alignment apparatus 160, sensors 178 and 180 may be deployed such that each of them is in close proximity to one of the members 162, 164, 166, 168, 170 or 172. The sensor face 184 associated with each of the sensors 178 and 180 is then positioned toward the workpiece receiving area 174. Therefore, when the workpiece 176 is placed within the receiving area 174, the sensors 178 and 180, by means of the magnetic field through face portions 184, will determine the proximity or placement of workpiece 176 within receiving area 174 in the aforedescribed manner. This determination of the presence of the workpiece 176, within area 174, will insure that workpiece 176 is properly aligned therein and the initiation of other manufacturing and/or assembly operations (i.e., the initiation of a dual press) may then begin. It should also be realized that sensors 178 and 180 may be electrically coupled to the aforedescribed monitor circuit 50 in the previously described manner, and the presence of workpiece 176 within the workpiece receiving area 174 may be affirmed by the generation of an electrical signal on line 156 to the typical output device 158 in the manner previously described.

Figure 10:
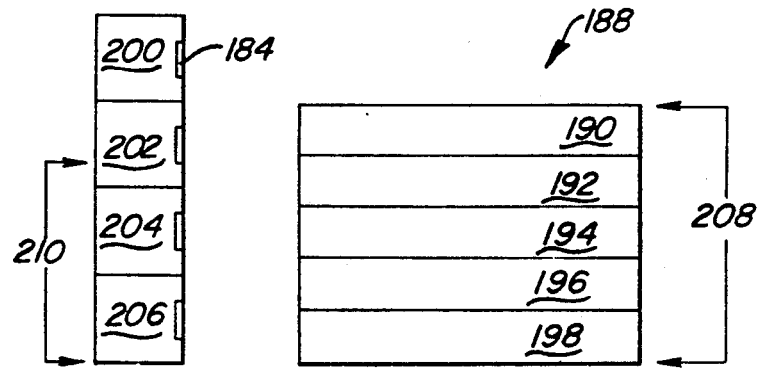
FIG. 10 is a pictorial view of proximity sensors made in accordance with a fourth embodiment of this invention and used to detect the height of a stack of metal workpieces.

Referring now to FIG. 10, there is shown a workpiece stacking arrangement 188 containing workpieces 190, 192, 194, 196 and 198, which are stacked in a storage arrangement. Sensors 200, 202, 204 and 206 are deployed in this fourth embodiment of this invention and are used to determine the overall height 208 of the stacking arrangement 188. That is, sensors 200, 202, 204 and 206 are substantially similar to sensors 178 and 180, shown generally in FIG. 8, and are vertically stacked upon each other such that the faces 184 associated therewith are directed to the stacking arrangements 188. Each of the sensors 200, 202, 204 and 206 has an unique height 210 associated therewith and is electrically coupled, in the aforedescribed manner, to a monitor circuit 50 and then to an output device 158. Height 210 is defined to be in one embodiment, the smallest distance from ground of a point upon face 184, of each of the sensors 200-206. The output device 158 may then be made to determine the relative height 208 of the stacking arrangement 188 by receiving each of the aforedescribed outputs of sensors 200, 202, 204 and 206. Each sensor 200-206 will provide an output signal only if the height 208 of stacking arrangement 188 is substantially equal to or greater than its unique height 210. Monitor circuit 50 may be made to display the approximate height 208, of arrangement 188, by simply determining which of the sensors 200, 202, 204 or 206 have provided an output signal and then displaying the largest height 210 associated with this group of output producing sensors 200, 202, 204 or 206. Such an embodiment, as shown in FIG. 10, may be used in a workpiece storage area in which it is desired to gain information concerning the relative amount of workpieces still left within the area for such things as inventory purposes.

While the above description constitutes the preferred embodiments of the present invention, it will be appreciated that the invention is susceptible to modification, variation and change without departing from the proper scope and fair meaning of the accompanying claims.

We claim:

1. A sensor for sensing the presence of a metal workpiece in contact with a surface of said sensor and removably fixed thereon, said sensor comprising:
    emission means for generating a magnetic field therefrom and causing said generated magnetic field to be directed to said metal workpiece and for generating a signal indicating said presence of said metal workpiece upon said surface of said sensor;
    metal casing means, surrounding said emission means, for defining said surface of said sensor in contact with said metal workpiece;
    means, coupled to said emission means, for causing said signal to be generated, for a specified time, in the absence of said metal workpiece from said surface of said sensor;
    said emission means comprises a coil having an impedance value associated therewith;
    circuit means, coupled to said coil, for exciting said coil at a frequency less than 20 KHz and for measuring an amount of change of said impedance value caused by the presence of said metal workpiece upon said surface of said sensor and for generating said signal in response to said measured change in said impedance value;
    said circuit means comprises threshold means, coupled to said coil and responsive to said change of said impedance value of said coil, for defining a threshold value and for comparing said measured amount of change of said impedance value of said coil with said threshold value and for allowing said generation of said signal to occur only if said measured amount of change of said impedance value is different than said threshold value; and
    said circuit means comprises a resistance bridge having four legs in which said coil and a capacitor comprise one of said legs and two nodes of said bridge form inputs to an amplifier and the amplifier output is connected to another mode of said bridge and controls a voltage controlled resistor which forms another leg of said bridge.

2. The sensor of claim 1 wherein said metal casing means comprises:
    stainless steel.

3. The sensor of claim 1 wherein said contact of said workpiece with said surface of said sensor causes an impaction force to be applied to said sensor, said metal casing means comprises:
    a top plate;
    an end plate; and
    beam means, vertically disposed between and coupled to said top plate and to said end plate for transferring said impaction force from said top plate to said end plate.

4. A sensor for sensing the presence of a metal workpiece in contact with a surface of said sensor and removably fixed thereon, said sensor comprising:
    impedance means, having an impedance value associated therewith, for generating a magnetic field therefrom and for causing said generated magnetic field to be received by said metal workpiece;
    oscillator means, coupled to said emission means, for exciting said impedance means at a frequency less than 20 KHz and for measuring a change of said impedance value caused by the presence of said metal workpiece upon said surface of said sensor and for generating a signal, having an amplitude associated therewith, in response to said measured change in said impedance;
    delay means, coupled to said oscillator means, for causing said signal to be generated for a predetermined amount of time in absence of said metal workpiece from said surface of said sensor; and
    metal casing means encapsulating said impedance means, said oscillator means, and said delay means for defining said surface of said sensor in contact with said metal workpiece;
    threshold means, coupled to said signal from said oscillator means, for defining a threshold value and for comparing said amplitude of said signal with said threshold value and for generating a second signal therefrom in response to said comparison; and
    a resistance bridge having four legs in which said induction means and a capacitor comprise one of said legs and two nodes of said bridge from inputs to an amplifier and the amplifier output is connected to another node of said bridge and controls a voltage controlled resistor which forms another leg of said bridge.

5. The sensor of claim 4 wherein said metal casing means comprises:
    stainless steel.

6. A sensor for sensing the presence of a metal workpiece in contact with a surface of said sensor and removably fixed thereon, said sensor comprising:
   (a) impedance means, having an impedance value associated therewith, for generating a magnetic field therefrom for causing said generated magnetic field to be received by said metal workpiece;
   (b) oscillator means, coupled to said impedance means, for exciting said impedance means at a frequency less than 20 KHz and for measuring a change of said impedance value caused by the presence of said metal workpiece upon said surface of said sensor and for generating a signal, having an amplitude associated therewith, in response to said measured change therefrom wherein said oscillator means comprises a resistance bridge having four legs in which said impedance means and a capacitor comprise one of said legs and two nodes of said bridge form inputs to an amplifier and the amplifier output is connected to another node of said bridge and controls a voltage controlled resistor which forms another leg of said bridge;
   (c) delay means, coupled to said oscillator means, for causing said signal to be generated for a predetermined time in absence of said metal workpiece from said surface of said sensor;
   (d) metal casing means, encapsulating said impedance means, said oscillator means, and said delay means for defining said surface of said sensor in contact with said metal workpiece; and
   (e) threshold means, coupled to said signal from said oscillator means, for defining a threshold value and for comparing said amplitude of said signal with said threshold value and for generating a second signal therefrom in response to said comparison.

7. The sensor of claim 6 further comprising:
   display means, coupled to said delay means, for causing a visual indication of said presence of said metal workpiece upon said surface of said sensor.

8. The sensor of claim 6 wherein said metal casing means comprises:
   stainless steel.

9. A metallic work piece alignment apparatus comprising:
   area means for defining a work piece placement area;
   sensor means, in close proximity to said area means, for determining the presence of said workpiece within said workpiece placement area;
   said sensor means comprises emission means for generating a magnetic field therefrom and causing said generated magnetic field to be directed to said metal workpiece and for generating a signal indicating said presence of said metal workpiece within said placement area;
   means coupled to said emission means for causing said signal to be generated, for a specified period of time, in absence of said metal workpiece from said placement area; said emission means comprises a coil having an impedance value associated therewith;
   circuit means, coupled to said coil, for exciting said coil at a frequency less than 20 KHz and for measuring a change of said impedance value caused by the presence of said metal workpiece with said workpiece placement area and for generating said signal in response to said measured change in said impedance value;
   said circuit means comprises threshold means, coupled to said coil and responsive to said measured change in said impedance value of said coil, for defining a threshold value and for comparing said measured change in said impedance value of said coil with said threshold value and for allowing said generating of said signal to occur only if said measured change of said impedance value is different then said threshold value; and
   said circuit means comprises a resistance bridge having four legs in which said coil and a capacitor comprises one of said legs and two nodes of said bridge form inputs to an amplifier and the amplifier output is connected to another node of said bridge and controls a voltage controlled resistor which forms another leg of said bridge.

10. A height determining apparatus for determining the height of a stack of metallic workpiece comprising:
   first sensor means for generating a first magnetic field therefrom and causing said first generated magnetic field to be received by said stack of metallic workpieces and for generating a first signal in response to said reception of said first generated magnetic field by said stack of metallic workpieces;
   second sensor means positioned upon said first emission means for generating a second magnetic field therefrom and causing said second generated magnetic field to be received by said stack of metallic workpieces and for generating a second signal in response to said reception of said second generated magnetic field by said stack of metallic workpieces; and
   height determination means, coupled to said first and second signals, for determining said height of said stack of metallic workpieces by use of said received first and second signals;
   said first and said second sensor means comprises coil means having an impedance value associated therewith;
   circuit means, coupled to said coil means, for exciting said coil means at a frequency less than 20 KHz and for measuring a change of said impedance value caused by the presence of said metal workpiece upon said surface of said sensor and for generating said first and said second signals in response to said measured change in said impedance value;
   said height determining apparatus further comprises threshold means, coupled to said coil means and responsive to said measured change in said impedance value of said coil means, for defining a threshold value and for comparing said measured change in said impedance value of said coil means with said threshold value and for allowing said generating of said signal to occur only if said measured change of said impedance value is different than said threshold value; and
   said circuit comprises
   a resistance bridge having four legs in which said coil means and a capacitor comprises one of said legs and two nodes of said bridge form inputs to an amplifier and the amplifier output is connected to another node of said bridge and controls a voltage controlled resistor which forms another leg of said bridge.

* * * * *

UNITED STATES PATENT AND TRADEMARK OFFICE
CERTIFICATE OF CORRECTION

PATENT NO. : 5,079,502

DATED : January 7, 1992

INVENTOR(S) : Steven A. Rogacki; Alfred F. Herbermann

It is certified that error appears in the above-identified patent and that said Letters Patent is hereby corrected as shown below:

In column 10, line 9, the word "generating" should read --generation--; and

In column 10, line 56, the word "generating" should read --generation--.

Signed and Sealed this

Thirtieth Day of March, 1993

Attest:

STEPHEN G. KUNIN

Attesting Officer

Acting Commissioner of Patents and Trademarks